(12) United States Patent
Sel et al.

(10) Patent No.: US 9,224,475 B2
(45) Date of Patent: Dec. 29, 2015

(54) STRUCTURES AND METHODS FOR MAKING NAND FLASH MEMORY

(75) Inventors: Jongsun Sel, Los Gatos, CA (US); Tuan Pham, San Jose, CA (US); Kazuya Tokunaga, San Francisco, CA (US); Hiro Kinoshita, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 401 days.

(21) Appl. No.: 13/592,780

(22) Filed: Aug. 23, 2012

(65) Prior Publication Data

US 2014/0054669 A1 Feb. 27, 2014

(51) Int. Cl.
| | |
|---|---|
| *H01L 21/336* | (2006.01) |
| *G11C 16/04* | (2006.01) |
| *H01L 21/28* | (2006.01) |
| *H01L 29/66* | (2006.01) |
| *H01L 27/115* | (2006.01) |
| *H01L 29/788* | (2006.01) |

(52) U.S. Cl.
CPC ...... *G11C 16/0483* (2013.01); *H01L 21/28273* (2013.01); *H01L 27/11524* (2013.01); *H01L 27/11529* (2013.01); *H01L 27/11536* (2013.01); *H01L 27/11541* (2013.01); *H01L 29/66825* (2013.01); *H01L 29/7881* (2013.01)

(58) Field of Classification Search
CPC .............................................. H01L 27/11541
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 5,887,145 A | 3/1999 | Harari et al. | |
| 6,046,935 A | 4/2000 | Takeuchi et al. | |
| 6,518,642 B2 * | 2/2003 | Kim et al. | 257/528 |
| 7,951,669 B2 | 5/2011 | Harari et al. | |
| 2002/0130374 A1 * | 9/2002 | Ueno et al. | 257/392 |
| 2005/0082602 A1 | 4/2005 | Okajima | |
| 2006/0030109 A1 | 2/2006 | Ranade et al. | |
| 2007/0012979 A1 | 1/2007 | Song et al. | |
| 2007/0057316 A1 | 3/2007 | Yaegashi | |
| 2010/0314679 A1 | 12/2010 | Lee | |

OTHER PUBLICATIONS

Notification of Transmittal of the International Search Report and the Written Opinion of the International Searching Authority, or the Declaration for Int'l Application No. PCT/US2013/053978 mailed Feb. 12, 2014, 18 pages.
Communication Relating to the Results of the Partial International Search, Internatioanl Application No. PCT/US2013/053978, mailed Nov. 5, 2013, 7 pages.

* cited by examiner

*Primary Examiner* — Jerome Jackson, Jr.
(74) *Attorney, Agent, or Firm* — Davis Wright Tremaine LLP

(57) ABSTRACT

A NAND flash memory chip includes wide openings in an inter-poly dielectric layer through which gaps are later etched to define structures such as select gates. Such select gates are asymmetric, with inter-poly dielectric on a side adjacent to a memory cell and no inter-poly dielectric on a side away from a memory cell. Gaps etched through such openings may also define peripheral devices.

8 Claims, 7 Drawing Sheets

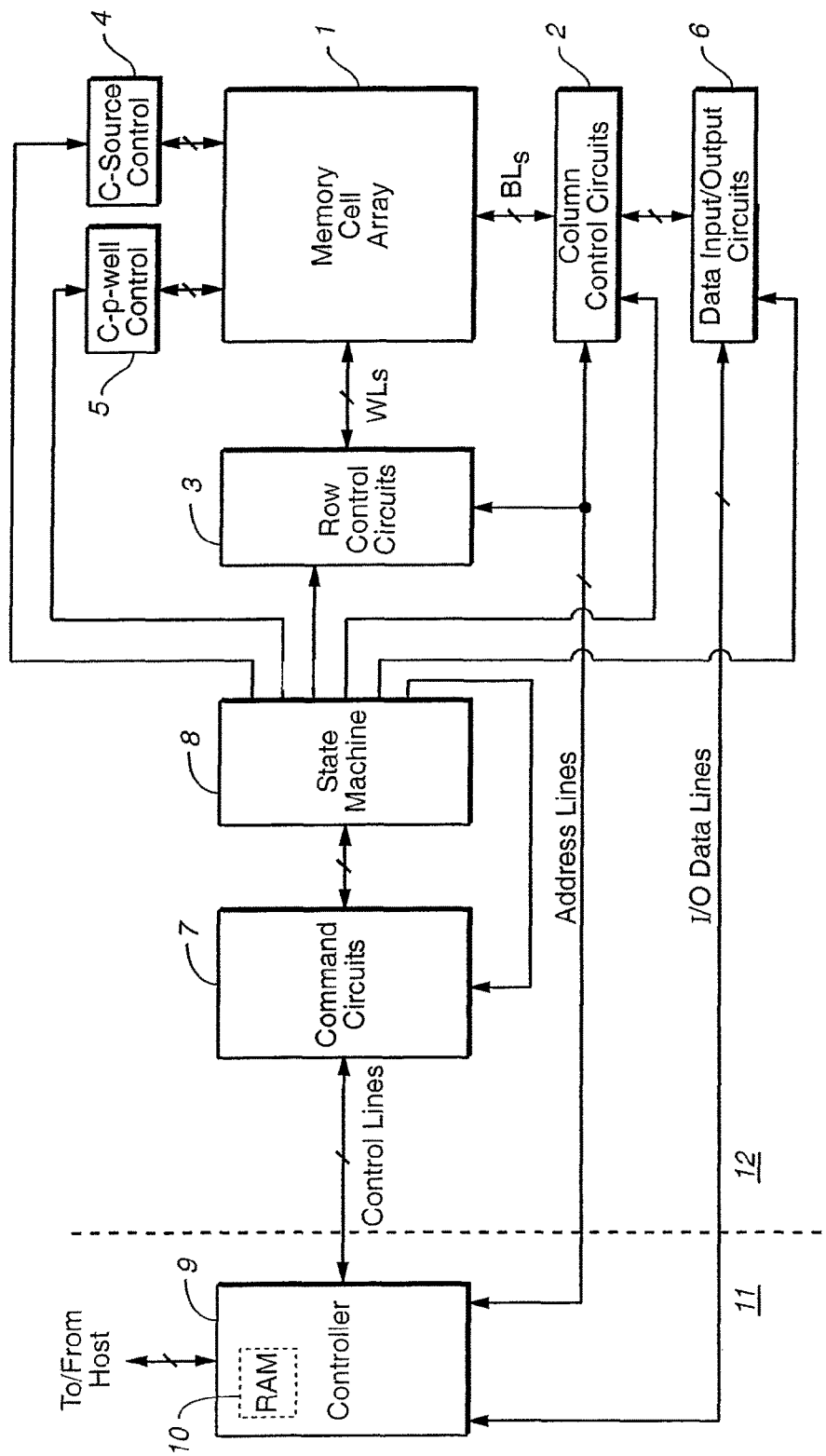
FIG._1
(Prior Art)

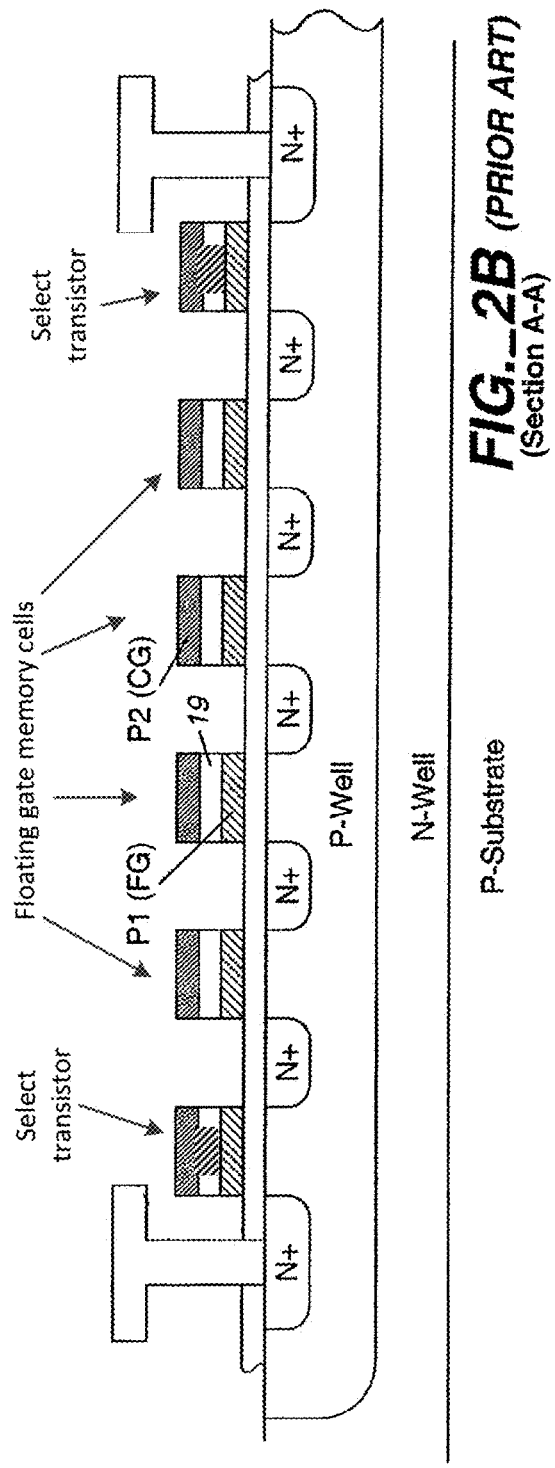

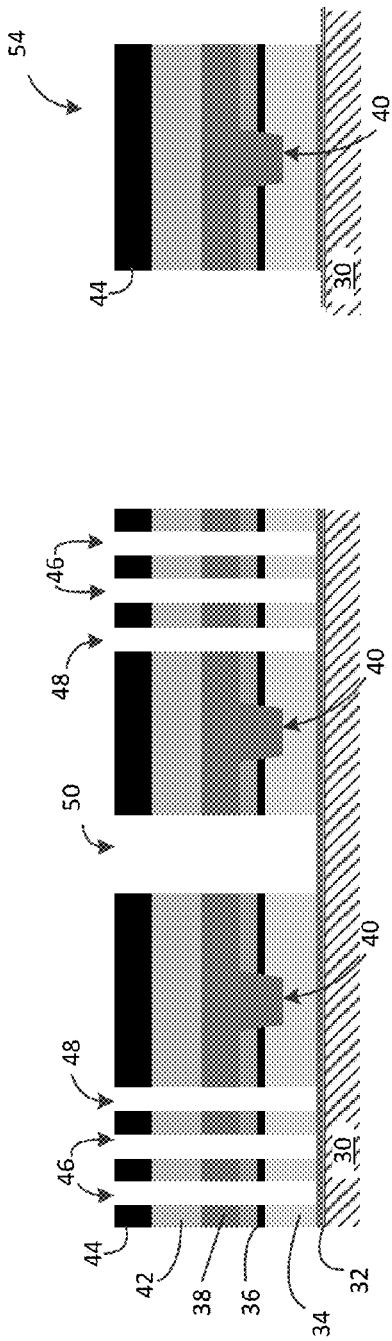
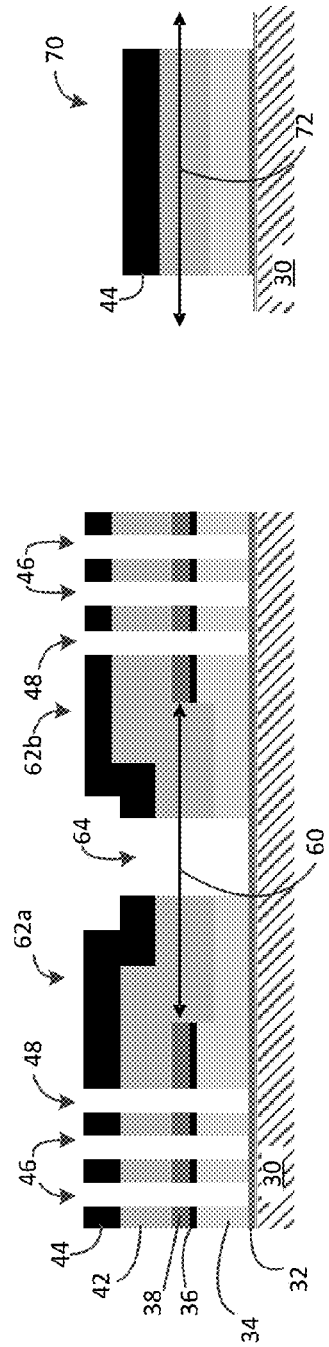
FIG. 3A (Prior Art)
FIG. 3B (Prior Art)
FIG. 4A
FIG. 4B

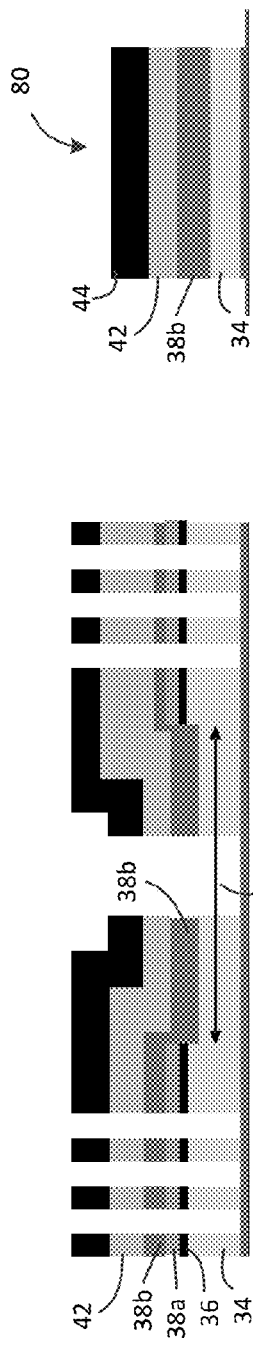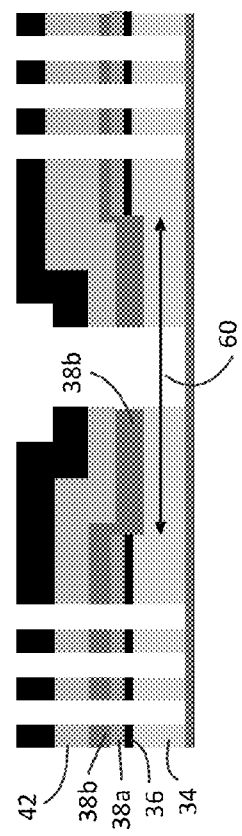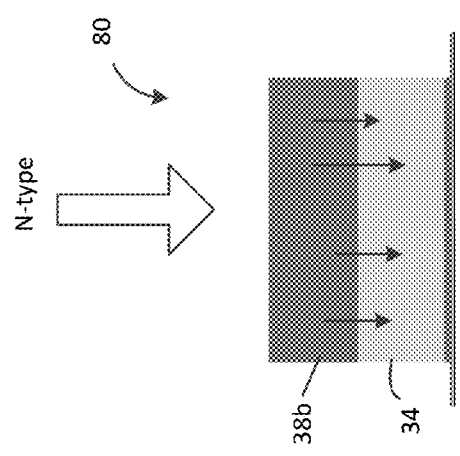
FIG. 5B
FIG. 5A
FIG. 6

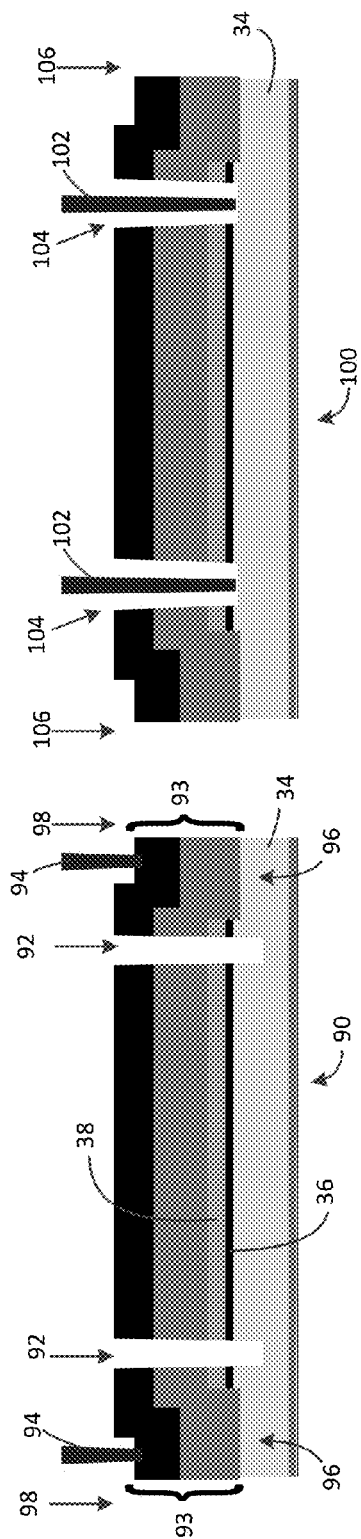
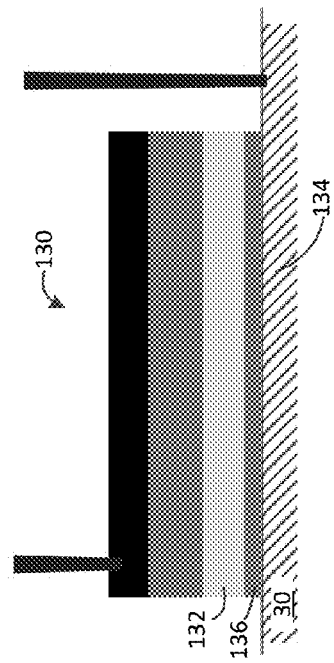
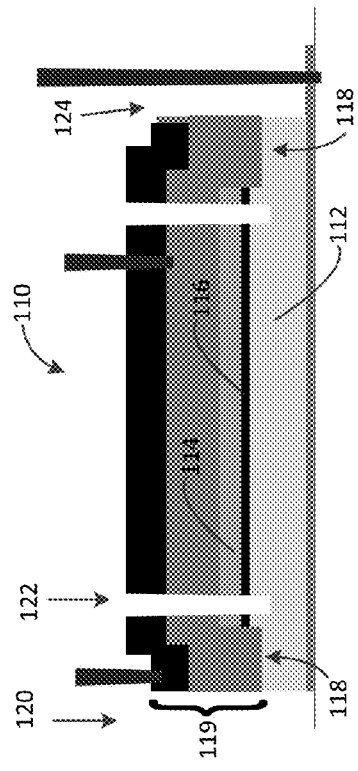

STRUCTURES AND METHODS FOR MAKING NAND FLASH MEMORY

BACKGROUND OF THE INVENTION

This invention relates generally to non-volatile semiconductor memories of the flash EEPROM (Electrically Erasable and Programmable Read Only Memory) type, their formation, structure and use, and specifically to methods of making NAND memory cell arrays.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 2B, a cross-section along line A-A of FIG. 2A). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer 19 (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

The top and bottom of the string connect to the bit line and a common source line respectively through select transistors (source select transistor and drain select transistor) in which the floating gate material (P1) is in direct contact with the control gate material (P2) through an opening formed in IPD material. The active gate thus formed is electrically driven from the periphery. Transistors in peripheral circuits are similarly formed by connecting floating gate material, P1, to overlying control gate material, P2, to form an active gate.

Select transistors and peripheral circuits are formed on the same chip as the memory cells but they have very different functions that require different device structures. Thus, a process that is suitable for forming a memory array may not be suitable for forming peripheral circuits and vice versa. While it may be possible to mask the memory array to perform process steps that affect only peripheral circuits and mask peripheral circuits to perform process steps that affect only the memory array, this increases the number of process steps to manufacture a memory chip. In general, the cost of manufacturing a memory chip increases with the number of processing steps used, and the number of defective units tends to increase also. So it is desirable to use the same process steps for the memory array and peripheral circuits.

Thus, there is a need for a memory chip manufacturing process that forms the memory cells, select transistors, and peripheral circuits in an efficient manner and there is a need for structures that can be formed accordingly.

SUMMARY OF THE INVENTION

When manufacturing NAND flash memory chips, wide openings may be made in an inter-poly dielectric (IPD) layer. These openings may extend to the edges of certain structures, such as select gates, that are later defined by etch steps so that the subsequent etches pass through the openings and thus pass through a stack at a point where there is no MD. Such a stack may be etched using a different etch to that used to define floating gate memory cells (where IPD layer is present). Asymmetric select gates may be formed by such a process, with IPD on one side (facing the NAND string) and no IPD on an apposite side (away from the NAND string). Various peripheral structures may be defined using the same etch that is used to separate select gates. Peripheral transistors may have all IPD layer material removed in their gates so that the gate is uniform laterally. Where a poly 2 layer is present in such a transistor it may be doped and the dopant may be diffused into the underlying poly 1 to change the majority charge carrier of both layers.

An example of a method of forming a flash memory integrated circuit includes: forming a floating gate layer; forming a dielectric layer on the floating gate layer; forming a control gate layer on the dielectric layer; removing portions of the control gate layer and the dielectric layer in opening areas; performing a first etch step that etches through the control gate layer, the dielectric layer, and the floating gate layer, to form separate floating gate structures; and performing a second etch step through opening areas to form separate select gate structures.

An additional control gate layer may be formed subsequent to the patterning and etching such that the additional control gate layer directly overlies the floating gate layer in the opening areas and directly overlies the control gate layer in other areas. The majority carrier of selected areas of the additional control gate layer and portions of the floating gate layer underlying the selected areas may be changed by ion implantation of only the additional control gate layer. The second etch step may establish a lateral dimension of a transistor formed in a peripheral area of the flash memory integrated circuit. The second etch step may also establish a lateral dimension of a resistor formed in a peripheral area of the flash memory integrated circuit. The second etch step may also establish a lateral dimension of at least one plate of a capacitor formed in a peripheral area of the flash memory integrated circuit. The capacitor has a capacitor dielectric that is formed from the dielectric layer. The capacitor may have a capacitor dielectric that is formed from a dielectric material between the floating gate layer and an underlying substrate. All material of the dielectric layer may be removed in the capacitor.

An example of a NAND flash memory die includes: (a) a string of floating gate memory cells connected in series, each cell comprising: a floating gate; a control gate; a dielectric layer portion between the floating gate and the control gate; and (b) a select transistor connected to the string of floating gate memory cells comprising: a gate structure that includes a dielectric layer portion along a side facing the string of transistors, and does not include a dielectric layer portion along a side facing away from the string of transistors.

The NAND flash memory die may also include (c) a transistor in a peripheral region, the transistor having a gate that includes a layer of material that is the same as used to form the floating gates, the layer in the gate having no directly overlying dielectric. The layer in the gate may be in direct contact throughout its lateral area with an overlying conductive layer. The overlying conductive layer may be formed of the same material that forms the control gates. The overlying conductive layer may have a different majority charge carrier to the control gates. The NAND flash memory die may also include (d) a resistor in the peripheral region, where the resistor is formed of material that is the same material that forms the floating gates, the resistor having at least one contact that includes a dielectric layer portion along a side facing the resistor and does not include a dielectric layer portion along a side facing away from the resistor. The NAND flash memory die may also include: (e) a capacitor in the peripheral region, the capacitor having a plate formed by material that is the same material that forms the floating gates, the plate having a contact that includes a dielectric layer portion along a side facing the capacitor and does not include a dielectric layer portion along a side facing away from the capacitor. The capacitor may have another plate formed by a substrate that is separated from the plate by a dielectric layer that is the same material that forms a gate dielectric in the floating gate memory cells. The capacitor may have another plate formed by material that is the same material that forms the control gates.

An example of a method of forming a flash memory integrated circuit includes: forming a floating gate layer of a first dopant type; forming an inter-poly dielectric layer on the floating gate layer; forming a first control gate layer of the first dopant type; patterning and etching to remove the first control gate layer and inter-poly dielectric layer in portions of peripheral circuits; subsequently depositing a second control gate layer of the first dopant type so that it directly contacts the floating gate layer in the portions of the peripheral circuits; implanting the second control gate layer of the first dopant type with a dopant of a second type in the peripheral circuits; and diffusing the dopant of the second type into the floating gate layer in the portions of the peripheral circuits to change the majority charge carrier of the floating gate layer in the portions.

The patterning and etching may remove the first control gate layer and inter-poly dielectric layer in portions of select gate transistor structures. The first dopant type may be a P-type dopant and the dopant of the second type may be an N-type dopant.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIG. 1 is a block diagram of a prior art memory system.
FIG. 2B is a cross-sectional view of the prior art NAND array of FIG. 2A taken along the line A-A.
FIG. 3A is a cross-sectional view of a prior art NAND array.
FIG. 3b is a cross-sectional view of a prior art peripheral transistor.
FIG. 4A is a cross-sectional view of a NAND array including a wide IPD opening.
FIG. 4B is a cross-sectional view of peripheral transistor without IPD material.
FIG. 5A is a cross-sectional view of an alternative NAND array using two poly 2 depositions.
FIG. 5B is a cross-sectional view of an alternative peripheral transistor where poly 2 directly overlies poly 1.
FIG. 6 illustrates ion implantation of poly 2 and diffusion of dopant from poly 2 to poly 1 to change majority charge carrier.
FIG. 7 is a cross-sectional view of a resistor.
FIG. 8 is a cross-sectional view of another resistor.
FIG. 9 is a cross-sectional view of a capacitor.
FIG. 10 is a cross-sectional view of another capacitor.

DETAILED DESCRIPTION OF EXEMPLARY EMBODIMENTS

Memory System

Figure 2A:
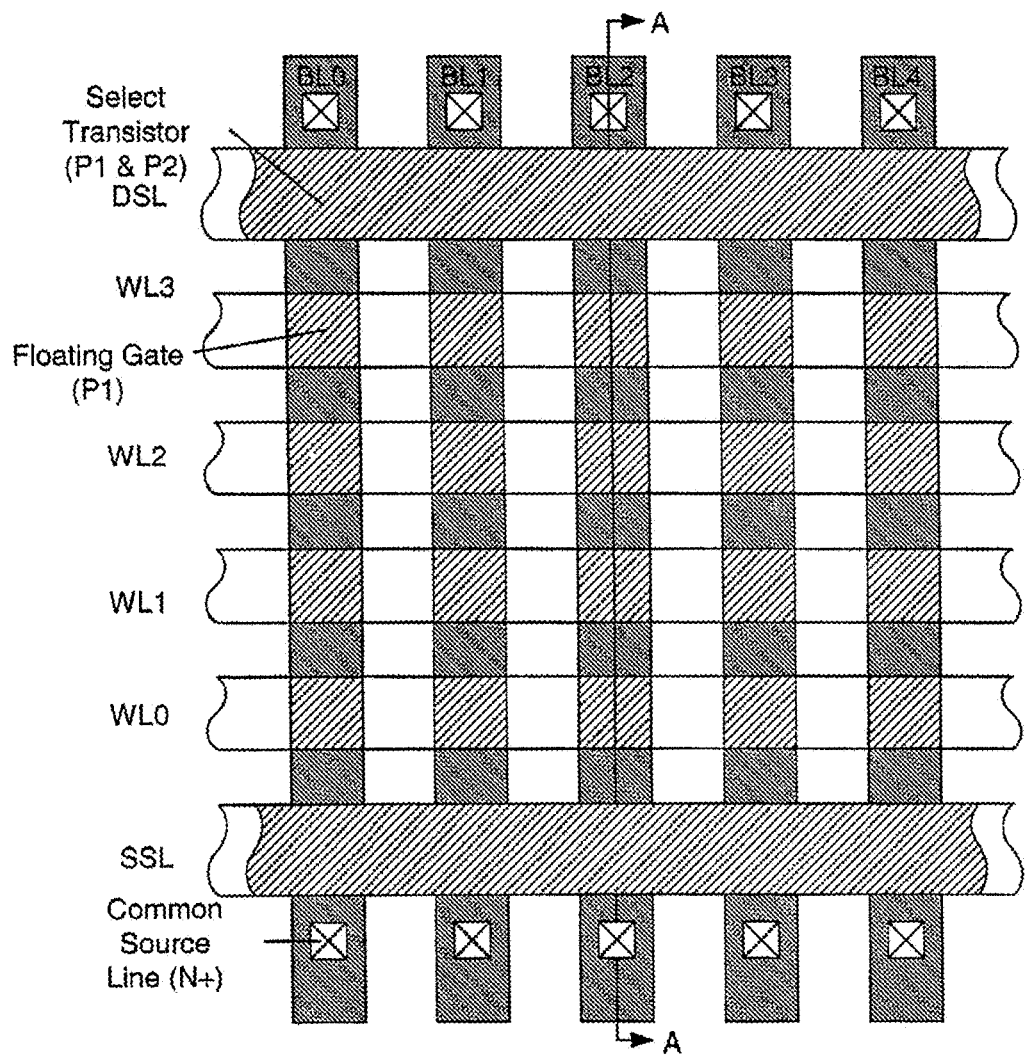
FIG. 2A is a plan view of a prior art NAND array.

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

A typical prior art NAND array includes control gate (word) lines extending across multiple strings over rows of floating gates with a suitable insulating dielectric layer in between. One control gate (word) line is used for each row of floating gates. In order to make an array with the floating and control gates self-aligned in a y-direction (along the lengths of the NAND strings), the same mask is generally used to form the control gates and to form the floating gates, which then have the same dimensions in the y-direction as the control gates. A single etch step may be used to form such control gate/floating gate stacks and to also define select gates.

FIG. 3A shows a cross section of a portion of a NAND flash memory array at an intermediate stage of fabrication (prior to that shown in FIG. 2B) after an etch step to form self-aligned floating gate/control gate structures in the prior art. FIG. 3A shows the underlying substrate 30 with an overlying gate dielectric layer 32 (e.g. gate oxide). A floating gate polysilicon layer 34 (poly 1 layer) lies on the gate dielectric layer 32 with an IPD layer 36 over the poly 1 layer 34. A control gate polysilicon (poly 2) layer 38 overlies the IPD layer 36. The poly 2 layer 38 in this example is formed using two deposition steps with patterning and etching steps between depositions. It can be seen that openings 40 are formed in the IPD layer 36 in certain locations where select gates are to be formed. Such openings are generally formed after a first poly 2 layer is deposited to cover the IPD layer (thus protecting the IPD layer). Then a second poly 2 layer is deposited after the openings are formed to contact the underlying poly 1 material wherever there are openings (e.g. in select transistors). A metal layer 42 (e.g. Tungsten or Tungsten Silicide) overlies the poly 2 layer 38 to provide lower electrical resistance in control gate lines. A hard mask material (e.g. TEOS) is deposited over the metal layer and is patterned to form a hard mask 44 which then defines the floating gate cells and select gates during a subsequent etch step.

The etch step used to define floating gates and select gates is an anisotropic etch (e.g. Reactive Ion Etch, or RIB etch) which is performed using the hard mask layer 44 so that openings 46, 48, 50 are formed down to the substrate 30. This separates floating gates along a NAND string and separates control gates according to the same pattern. This etch step also defines the dimensions of select gates along the direction of the NAND string. It should be noted that this etch step etches through the same stack of layers (including IPD layer 36) at every point shown in FIG. 3A, between floating gates at openings 46, between floating gates and select gates at openings 48 and between select gates at openings 50. Thus, a portion of the IPD layer is present at either side of the select gates shown. While openings 40 form an electrical connection through the IPD layer 36 in select gates, at least some IPD layer is maintained at either side of the select gate so the stack of layers is the same at openings 48, 50 and between floating gate memory cells at openings 46. This avoids potential problems of overetching if such IPD layer portions were not present.

The etch step that forms the separate stacks shown in FIG. 3A in the memory array may also be used to form transistors and other structures in peripheral areas where peripheral circuits are formed. FIG. 3B shows an example of a transistor 54 that is defined by the same etch (i.e. the sides of the transistor shown are formed by the same etch step, etching through the same stack of layers using hard mask 44). Like the select transistors of FIG. 3A, transistor 54 includes an opening 40 in the IPD that forms an electrical connection between poly 1 and poly 2 layers, thus forming a single active gate instead of a floating gate and control gate. Like the select gate, this transistor has portions of IPD layer remaining at either side so that the stack that is etched is the same in this peripheral area as in the memory array and overetching is avoided.

According to an aspect of the present invention, large openings are formed in an IPD layer where select gates are to be formed and a subsequent etch step that is used to define select gates passes through such openings (i.e. through a stack at locations where the IPD is completely removed). This select gate etch step is different from the etch step used to define memory cells (etch step forming control gate/floating gate stack). Thus, the extent of a select gate along the NAND string direction may be determined by two different etch steps, one that separates the select gate from an adjacent memory cell by etching through a stack that includes IPD, and another that separates the select gate from an adjacent select gate by etching through a stack that does not include IPD.

FIG. 4A shows a cross section of a portion of a memory array that corresponds to the portion shown in FIG. 3A. FIG. 4A shows a large opening (identified by arrow 60) in the IPD layer 36 that extends between select gates 62a, 62b and occupies most of the lateral area of the select gates. Within opening 60 is an etched gap 64 that separates select gates 62a, 62b. It can be seen that gap 64 is formed by etching through the opening area 60. As in the prior art, a layer of polysilicon 38 (poly 2) is formed over the IPD layer 36 before patterning for IPD etch. However, in this example, there is no subsequent deposition of another poly 2 layer so there is no poly 2 in contact with poly 1 layer 34. Instead, the gate metal layer 42 is in direct contact with the poly 1 layer 34 in opening 60 in the select transistors 62a, 62b.

It can be seen that the select transistors 62a, 62b are not symmetric. A portion of IPD layer 36 is incorporated into each select transistor on sides facing the NAND string (i.e. along openings 48 between the select transistors and adjacent floating gate memory cells). No portion of IPD layer 36 is present on the side of the select transistors facing away from the NAND strings (i.e. along opening 64 separating select transistors 62a and 62b).

FIG. 4B shows a portion of a peripheral area of the same die as FIG. 4A. In particular, FIG. 4B shows a transistor 70 formed in such a peripheral area, similar to transistor 54 of FIG. 3B. However, transistor 70 has no remaining portion of IPD layer 36 (or poly 2 portion) thus providing a gate that is uniform in the horizontal plane with metal layer 42 in contact with poly 1 layer 34 throughout. An opening area formed in the IPD layer 36 and poly 2 layer 38 extends across the entire transistor as indicated by arrow 72. The pattern and etch steps that define the gate of the transistor are the same pattern and etch steps used to form select gates (i.e. using hard mask 44 and same anisotropic etch) and thus the etch is tuned for etching through a stack that does not include IPD.

Another memory array structure with a large IPD opening 60 is shown in FIG. 5A. In this case, poly 2 layer 38 is deposited in two steps. A first poly 2 layer 38a is deposited directly on IPD layer 36. Later, after formation of large openings 60 in IPD layer 36 and poly 2 layer 38a, a second poly 2 layer 38b is deposited. Thus, the second poly 2 layer 38b overlies poly 1 layer 34 in the openings 60 (there is no direct contact between poly 1 and metal layers).

FIG. 5B shows a transistor 80 formed in a peripheral area of the memory die of FIG. 5A. The etch step used to define the gate shown may be the same etch step used to separate select gates of FIG. 5A (using hard mask 44 to etch the same stack of layers). Here, there is direct contact between poly 1 layer 34 and poly 2 layer 38b all across the gate of transistor 80 (i.e. there is no portion of IPD layer 36 between these poly layers. This uniform direct contact may be used to simplify manufacture.

In some memory chips, it is desirable to form transistors with different majority charge carriers in the memory array and in peripheral areas. For example, P-type polysilicon may be preferable for memory cells (i.e. for poly 1 and poly 2 layers in memory array) and N-type polysilicon may be preferable for peripheral circuits (i.e. for poly 1 and/or poly 2 in peripheral areas). In some cases, a polysilicon layer is deposited or doped to have a particular type of dopant. Then, it is patterned and doped again by ion implantation so that the majority charge carrier is changed in exposed regions (e.g. poly 1 and/or poly 2 may be deposited as P-type, then in the periphery they may be changed to N-type by ion implantation). Where both poly 1 and poly 2 have their majority charge carrier changed this generally requires two separate patterning and ion implantation sequences.

According to an example, a transistor gate that includes two layers of polysilicon in direct contact throughout may have its majority charge carrier changed by ion implantation of only the overlying polysilicon layer and by diffusing the dopant from the overlying polysilicon layer into the underlying layer. This obviates the need to separately pattern and ion implant the underlying polysilicon layer.

FIG. 6 shows an example of transistor 80 at an intermediate stage of formation (prior to that shown in FIG. 5B, i.e. prior to deposition of metal layer 42 or hard mask layer 44). With the memory array masked with an appropriate mask layer to stop ion implantation, the poly 2 layer 38b in the peripheral area is implanted with a dopant that is the opposite type to the dopant previously present in the poly 2 layer. For example, where poly 2 was previously P-type (e.g. doped with Boron), it may be ion implanted with an N-type dopant (e.g. Phosphorus) to change its majority charge carrier from holes to electrons. The underlying layer of poly 1 material 34, which was also previously P-type may be changed to N-type by diffusion of the N-type dopant from the poly 2 layer to the poly 1 layer as indicated by arrows. Dopant ions are free to diffuse from poly 2 to poly 1 all across the transistor because there is no IPD layer remaining at any point within transistor 80. Such diffusion may require an additional heating (annealing) step or may occur during ion implantation.

In addition to the select gate transistors and peripheral transistors discussed above, other components formed in the peripheral areas of a memory chip or die may be efficiently manufactured according to aspects of the present invention.

FIG. 7 shows an example of a resistor 90 formed using the process that forms the memory array of FIG. 4A. The resistor 90 is formed by a portion of N-type polysilicon (poly 1 layer 34) that extends between two openings 92 formed by an etch step, which may be the same etch step used to separate select gates (or may be a different etch step). On either side of the resistor are contacts 94 that connect the resistor through a pillar structures 93. Large IPD layer openings 96 are formed to provide low vertical resistance in these pillar structures. Pillar structures 93 may be defined by the select gate etch on either side, with the etched openings 98 extending to the substrate on sides away from resistor 90, and etched openings 92 extending partially into the poly 1 layer 34 on sides facing resistor 90 (thus providing electrical connection to the resistor through the remaining poly 1 layer 34). Thus, the stack of pillar structure 93 is asymmetric with IPD on the side facing resistor 90 and no IPD on the side away from resistor 90. Above the resistor 90, the IPD layer 36 remains intact and prevents any damage to the resistor material from etching (which could affect the resistance of the resistor). This portion of IPD layer 36 also stops any dopant from the poly 2 layer 38 from entering resistor 90. Thus, poly 1 and poly 2 layers may have different doping and different majority charge carriers. For example, even when some poly 2 in the periphery is changed from one dopant type to another (e.g. P-type to N-type) as shown in FIG. 6, the underlying poly 1 in the resistor remains unchanged because of the portion of IPD layer 36 in resistor 90. Poly 1 and poly 2 may be of the same types as in the memory array (e.g. both P-type) or may be different (e.g. both N-type, or one N-type) if desired.

FIG. 8 shows another example of a resistor 100 formed using the process of FIG. 4A. Here metal contacts 102 are formed that directly contact poly 1 layer 34. This may require separate etch steps to form openings 104 for metal contacts and to form openings 106 to isolate the resistor 100 from adjacent components. Isolation from adjacent components may be achieved using the select gate etch as before. Alternatively, both openings 104 and 106 may be formed by the same etch step, which may be the etch step used to form select gates.

FIG. 9 shows an example of a capacitor 110 formed by a poly 1 plate 112 and a poly 2 plate 114, separated by an IPD layer portion 116 that acts as the capacitor dielectric. Contact to the poly 1 plate 112 of the capacitor is through a pillar structure 119 (similar to pillar structure 93 above) which includes a wide opening 118 in the IPD layer. Opening 120 passes through wide IPD opening 118 and may be formed by the same etch used to separate select gates. Also the etch used to define the other side of pillar structure (side facing the capacitor) at opening 122 may be the same etch, which because it passes through the IPD layer at this point stops short of the underlying substrate and thus leaves sufficient poly 1 to connect the poly 1 plate 112 to the pillar structure 119. A similar isolation etch defines the other side of the capacitor, and an opening to the substrate 124 may be formed in an IPD opening 118 also using the same etch. Like the resistor pillar structure 93 above, capacitor pillar structures 119 are asymmetric with IPD on the sides facing capacitor 110 and no IPD on sides away from capacitor 110. Doping of poly 1 and poly 2 layers that form capacitor plates may be controlled as described above so that each may be either N-type or P-type as desired.

FIG. 10 shows another example of a capacitor 130 formed in a peripheral area by the process used to form the memory array of FIG. 4A. The plates of the capacitor are formed by poly 1 layer portion 132 and underlying substrate portion 134, separated by gate dielectric layer portion 136 which acts as the capacitor dielectric. All IPD dielectric and poly 2 is removed in this structure (i.e. a large IPD layer opening extends across the capacitor). This structure can be formed using the same etch as used to form select gates.

Figure 11:
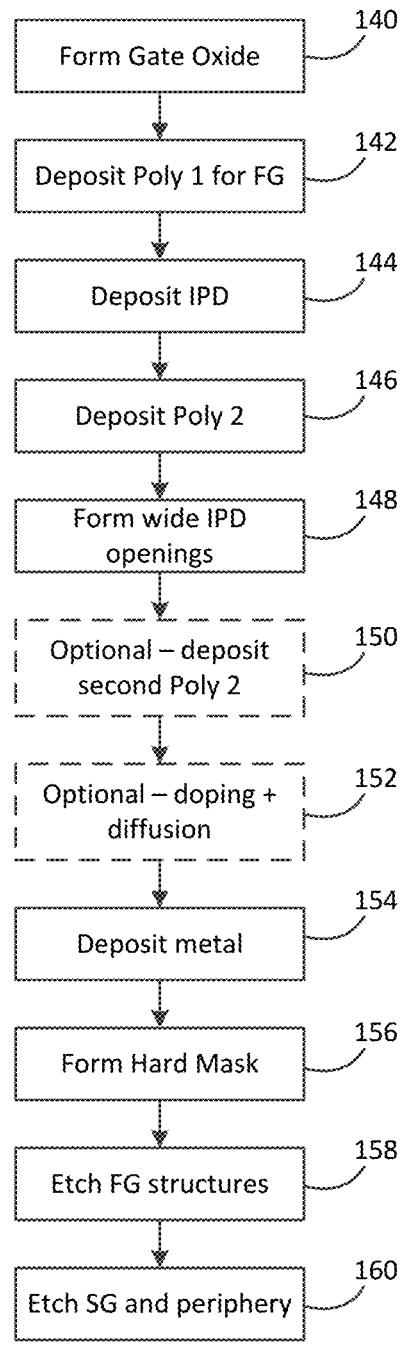
FIG. 11 illustrates principal steps in manufacturing a NAND flash memory chip.

FIG. 11 is a flowchart illustrating certain principal steps in a process for manufacturing a memory chip as described above. A gate oxide layer is first formed 140 over the surface of a substrate. Then a first polysilicon layer is deposited 142 which later forms floating gates in memory cells, and forms other structures in other areas of the memory chip. An IPD layer is deposited 144 over the poly 1 layer and a poly 2 layer is deposited 146 over the IPD layer. Wide openings are then formed 148 in the IPD layer (and through the overlying poly 2 layer). These wide openings are fainted where select gates are to be located and extend beyond certain edges of select gates. Wide openings also occur where various peripheral components are to be located including where contacts to resistors and capacitors are to be located. Wide openings may extend across the entire area where gates of certain peripheral transistors are to be located. An additional poly 2 layer may then be deposited 150 to contact exposed poly 1 in openings, though this step is optional and a single poly 2 layer may also be used. Where a second poly 2 layer is used, this layer may be doped 152 and the dopant may be diffused into the underlying poly 1 to change the majority charge carrier of both the poly 2 and poly 1 in the areas where they are in contact using a single ion implantation step. Subsequently, a metal, such as Tungsten, is deposited 154. A hard mask layer is formed 156 over the metal layer and is used to define openings where etching is to occur. A first etch is performed 158 to form floating gate memory cells with self-aligned control gates and floating gates. A second etch is performed 160 to separate select gates and to define various structures in peripheral areas.

CONCLUSION

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

The invention claimed is:

1. A method of forming a flash memory integrated circuit comprising:
   forming a floating gate layer;
   forming a dielectric layer on the floating gate layer;
   forming a control gate layer on the dielectric layer;
   removing portions of the control gate layer and the dielectric layer in opening areas;
   subsequently, forming an additional control gate layer such that the additional control gate layer directly overlies the floating gate layer in the opening areas and directly overlies the control gate layer in other areas;
   performing a first etch step that etches through the control gate layer, the dielectric layer, and the floating gate layer, to form separate floating gate structures; and
   performing a second etch step through opening areas to form separate select gate structures.

2. The method of claim 1 further comprising changing the majority carrier of selected areas of the additional control gate layer and portions of the floating gate layer underlying the selected areas by ion implantation of only the additional control gate layer.

3. The method of claim 1 wherein the second etch step establishes a lateral dimension of a transistor formed in a peripheral area of the flash memory integrated circuit.

4. The method of claim 3 wherein the second etch step further establishes a lateral dimension of a resistor formed in a peripheral area of the flash memory integrated circuit.

5. The method of claim 4 wherein the second etch step further establishes a lateral dimension of at least one plate of a capacitor formed in a peripheral area of the flash memory integrated circuit.

6. The method of claim 5 wherein the capacitor has a capacitor dielectric that is formed from the dielectric layer.

7. The method of claim 5 wherein the capacitor has a capacitor dielectric that is formed from a dielectric material between the floating gate layer and an underlying substrate.

8. The method of claim 7 further comprising removing all material of the dielectric layer in an area where the capacitor is subsequently formed.

* * * * *